(12) United States Patent
Bancel et al.

(10) Patent No.: US 7,629,818 B2
(45) Date of Patent: Dec. 8, 2009

(54) METHOD FOR CHECKING THE INTEGRITY OF A CLOCK TREE

(75) Inventors: Frédéric Bancel, Lamanon (FR); Nicolas Berard, Trets (FR)

(73) Assignee: STMicroelectronics SA, Montrouge (FR)

( * ) Notice: Subject to any disclaimer, the term of this patent is extended or adjusted under 35 U.S.C. 154(b) by 117 days.

(21) Appl. No.: 12/020,810

(22) Filed: Jan. 28, 2008

(65) Prior Publication Data

US 2008/0231325 A1    Sep. 25, 2008

(30) Foreign Application Priority Data

Jan. 29, 2007    (FR) .................................... 07 00592

(51) Int. Cl.
    *H03L 7/00*    (2006.01)
(52) U.S. Cl. ................ 327/141; 327/3; 327/7; 327/142; 327/143; 327/144
(58) Field of Classification Search ................ 327/141, 327/142, 143, 144
    See application file for complete search history.

(56) References Cited

U.S. PATENT DOCUMENTS

| 5,309,111 | A | * | 5/1994 | McNeely et al. | ................ | 327/7 |
| 5,498,983 | A | * | 3/1996 | Schoellkopf | .................... | 327/3 |
| 6,556,057 | B2 | * | 4/2003 | McClure | ..................... | 327/143 |

OTHER PUBLICATIONS

Fluker et al., "High Resolution Skew Measurement," Wescon Conference Record, Nov. 17-19, 1992, North Hollywood, California, pp. 15-20.

* cited by examiner

*Primary Examiner*—Lincoln Donovan
*Assistant Examiner*—John W Poos
(74) *Attorney, Agent, or Firm*—Lisa K. Jorgenson; Robert Iannucci; Seed IP Law Group PLLC (57) ABSTRACT

A method and device detect synchronization errors between logic signals of a group of logic signals. A control word is loaded into a shift register arranged in loop and clocked by resulting logic signals equal to the result of the OR logic function and to the result of the AND logic function applied to the logic signals of the group of logic signals. The value of the control word is monitored as it propagates in the shift register, and a synchronization error signal is sent if the control word changes value. Application in particular for checking the integrity of a clock tree in an integrated circuit.

25 Claims, 12 Drawing Sheets

METHOD FOR CHECKING THE INTEGRITY OF A CLOCK TREE

CROSS-REFERENCE TO RELATED APPLICATION

This application claims the benefit under 35 U.S.C. § 119 (a) of French Patent Application No. 07 00592, filed Jan. 29, 2007, which is incorporated herein by reference in its entirety.

BACKGROUND

1. Technical Field

The present invention relates to a method and a device for checking the integrity of a clock tree, and more particularly a method and a device for detecting synchronization errors between clock signals present in a same clock tree.

2. Description of the Related Art

The logic circuits present in secured integrated circuits, like integrated circuits for chip cards, are subject to various attacks from defrauders who attempt to discover their structure and/or the secrets they comprise. They are for example encryption circuits of the types DES, AES, RSA . . . , microprocessors programmed to execute encryption algorithms, register banks comprising secret keys, etc.

At the present time, the most advanced hacking methods consist in injecting errors in an integrated circuit during the execution of so-called sensitive operations, for example operations of authentication or operations of execution of an encryption algorithm.

Such attacks, called attacks by error injection or by fault injection, can occur during so-called sensitive phases of calculations, for example during phases of calculation of an identification code, or during the reading of an encryption key in a memory. They make it possible, in combination with mathematical models and from wrong results obtained intentionally thanks to perturbations, to define a secret element like an encryption key or a password, to deduce the structure of an encryption algorithm and/or the secret keys the algorithm uses, etc.

In particular, the localized attacks consist in introducing perturbations into a determined point of the circuit, for example by means of a laser beam or an X-ray beam. A localized attack may concern the supply voltage, a data path, or the clock signal of the integrated circuit.

Figure 1:
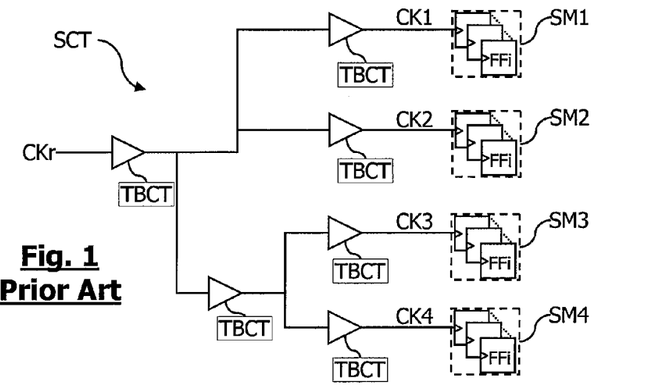
FIG. 1 previously described schematically shows a synchronous circuit comprising a clock tree, FIGS. 2A to 2D previously described are chronograms showing clock signals present in branches of the clock tree, FIGS. 3 to 6 previously described are chronograms respectively showing an injection into the clock tree of an error of a first type, a second type, a third type and a fourth type, FIG. 7 schematically shows a synchronous circuit comprising a clock tree and a device for detecting synchronization errors between branches of the clock tree.
Figure 2A:
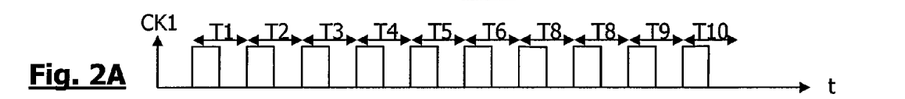
Figure 2B:
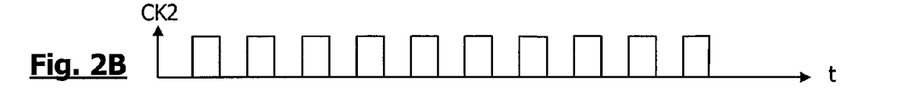
Figure 2C:
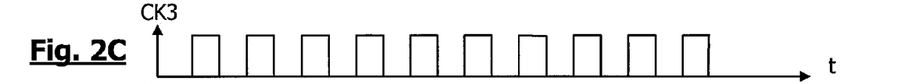
Figure 2D:
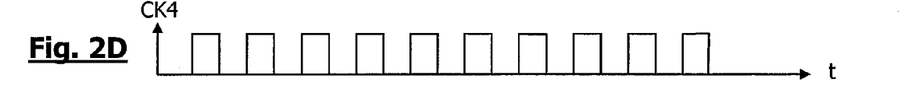

FIG. 1 schematically shows a synchronous circuit SCT comprising four synchronous modules SM1, SM2, SM3, SM4 clocked by a clock signal CKr. The synchronous modules SM1-SM4 are simplified in block form, each comprising a set of synchronous flip-flops FFi. Each module receives the clock signal through conduction paths of various lengths forming a clock tree. More precisely, each synchronous module receives a clock signal CK1, CK2, CK3, CK4 which comes from the signal CKr but which is susceptible of having proper time differences in relation to the signal CKr, in particular in the event of error injection.

At the time of designing the synchronous circuit, the clock tree is balanced by means of delay circuits TBCT so that the clock signals CK1 to CK4 are in phase, as shown in FIGS. 2A to 2D that represent each clock signal CK1 to CK4. Thus, the signals CK1 to CK4 have the same phase, the same cycles T1, T2, T3 . . . and the same period T. Despite this balance, the various clock signals CK1 to CK4 can have, one relatively to the other, a residual time shift SKW" (skew) subsequently called "tolerated error". The tolerated error is not represented here and is very inferior to the clock period T. It does not cause any error in the operation of the synchronous modules.

Due to its dispersion in the various branches of the clock tree, the clock signal CKr is particularly subject to localized error injections. This vulnerability lies in the fact that an attack can switch only a part of the tree, and consequently only a part of the synchronous flip-flops of the synchronous circuit. More particularly, the conceivable localized attacks can be classified into four different types, and consist in:
 delaying a clock edge (slowing down),
 advancing a clock edge (advance),
 adding a clock square wave, or
 deleting a clock square wave.

Figure 3:
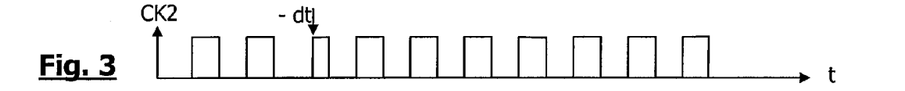

An example of attack of the first type is shown in FIG. 3. The error injection is applied to the clock signal CK2 during the cycle T3, and causes a delay −dt in the apparition of the rising edge of the clock signal CK2, which should normally occur at the beginning of the cycle T3.

Figure 4:
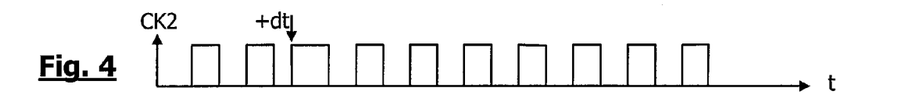

An example of attack of the second type is shown in FIG. 4. The error injection is applied to the clock signal CK2 and causes an advance +dt in the apparition of the rising edge of the clock signal CK2, which appears here before the end of the cycle T2 instead of appearing at the beginning of the cycle T3.

Figure 5:
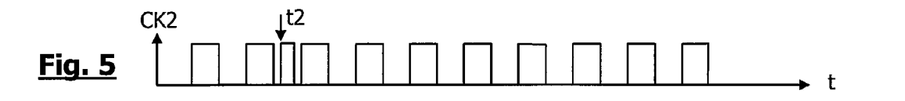

An example of attack of the third type is shown in FIG. 5. The error injection is applied to the clock signal CK2 during the cycle T2 and causes the apparition of an additional clock square wave at an instant t2 between the falling edge of the clock square wave emitted during the cycle T2 and the rising edge of the clock square wave emitted at the beginning of the cycle T3.

Figure 6:
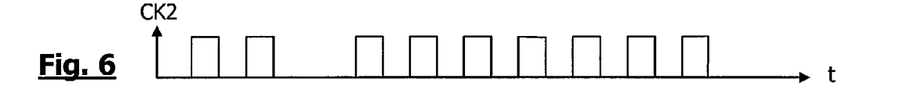

An example of attack of the fourth type is shown in FIG. 6. In this example, the error injection is applied to the clock signal CK2 and causes the clock square wave disappearing at the beginning of the cycle T3.

To counter such attacks, the methods usually implemented consist in detecting an anomaly in the data supplied by the synchronous circuit. These methods lay for example on a software or hardware redundancy of the synchronous circuit. The software redundancy consists in the fact of recalculating by means of a program the result supplied by the synchronous circuit, the redundant calculation being carried out by a microprocessor. In addition, the hardware redundancy consists in reproducing in several examples the "sensitive" parts of the synchronous circuit, and in comparing the results supplied by the redundant circuits, the majority result may be retained as reliable result in the event of an inconsistency of results. Globally, these methods involve an important occupation of the available semiconductor surface (hardware redundancy) or a noteworthy slowing down of the operation of the synchronous circuits (software redundancy).

BRIEF SUMMARY

Instead of detecting an error of result subsequent to an error injection, which constitutes the second effect of the error injection, one can detect the first effect of the error injection, i.e. the apparition of a loss of synchronism between the clock signals present in the branches of the clock tree.

Thus, one embodiment suggests checking the integrity of each branch of a clock tree in relation to the other branches of the tree.

More particularly, one embodiment suggests checking that the branches of clock tree are switched at each clock cycle, that they are switched only once at each clock cycle without the apparition of a time shift higher than the maximum value of the error tolerated SKW. Thus the embodiment makes it possible to guarantee that there was no loss or addition of a clock cycle, or any delay or advance on each branch of the clock tree.

An embodiment of the invention relates to a method for detecting synchronization errors between logic signals of a group of logic signals, comprising the steps of: providing a shift register comprising a first synchronous cell and a second synchronous cell; loading a control word into the shift register; clocking the first synchronous cell by means of a first logic signal resulting equal to the result of the OR logic function applied to the logic signals of the group of logic signals; clocking the second synchronous cell by means of a second logic signal resulting equal to the result of the AND logic function applied to the logic signals of the group of logic signals; propagating the control word in loop in the shift register at the rhythm of the resulting logic signals and monitoring the value of the control word as it propagates, and detecting a synchronization error if the control word changes value.

According to one embodiment, the method comprises the steps of producing an asynchronous error signal having an inactive value and an active value, and switching the asynchronous error signal to the active value when the control word changes value, sampling the asynchronous error signal after each shift of the control word in the shift register, in order to filter synchronization errors tolerated, and to produce a synchronous error signal.

According to one embodiment, the synchronous error signal is cyclically refreshed by edges of the first resulting logic signal.

According to one embodiment, the method comprises the steps of loading in the shift register a control word comprising at least one couple of control bits having inverse logic values, and detecting a synchronization error if the control bits have the same value during the propagation of the control word in the shift register.

According to one embodiment, the method comprises a step of introducing between the first synchronous cell and the second synchronous cell a propagation delay at least equal to a maximum time shift tolerated between the logic signals.

According to one embodiment, the step of loading the control word comprises a step of initializing each synchronous cell of the shift register with a signal for setting the cell to 0 or 1.

According to one embodiment, the synchronous cells of the shift register are flip-flops, each flip-flop comprising a clock input receiving one of the resulting logic signals, a data input and an inverting or non-inverting data output.

According to one embodiment, the logic signals which synchronization must be monitored are clock signals taken from various points of a clock tree and originally from a same clock signal.

An embodiment of the invention also relates to a device for detecting synchronization errors between logic signals of a group of logic signals, comprising a shift register comprising a first synchronous cell and a second synchronous cell, means for loading a control word into the shift register, means for connecting the output of the shift register to the input of the shift register, means for clocking the first synchronous cell by means of a logic signal resulting equal to the result of the OR logic function applied to the logic signals of the group of logic signals, means for clocking the second synchronous cell by means of a logic signal resulting equal to the result of the AND logic function applied to the logic signals of the group of logic signals, and means for monitoring the value of control word as it propagates in loop in the shift register at the rhythm of the logic signals, and emitting a synchronization error signal if the control word changes value.

According to one embodiment, the means for monitoring the value of the control word comprise means for producing an asynchronous error signal having an inactive value and an active value, and switching the asynchronous error signal to the active value when the control word changes value, and means for sampling the asynchronous error signal after each shift of the control word in the shift register, in order to filter synchronization errors tolerated, and to produce a synchronous error signal.

According to one embodiment, the means for sampling the asynchronous error signal are driven by edges of the first resulting logic signal.

According to one embodiment, the means for loading a control word are arranged to load in the shift register a control word comprising a couple of control bits having inverse logic values, and the means for monitoring the value of the control word are arranged to emit the error signal if the control bits have the same value during the propagation of the control word in the shift register.

According to one embodiment, the shift register comprises, between the first synchronous cell and the second synchronous cell, a delay circuit introducing a propagation delay at least equal to a maximum time shift tolerated between the logic signals.

According to one embodiment, the means for loading a control word in the shift register comprise a signal for setting each synchronous cell of the shift register to 0 or 1.

According to one embodiment, the synchronous cells of the shift register are flip-flops, each flip-flop comprising a clock input receiving one of the resulting logic signals, a data input and an inverting or non-inverting data output.

According to one embodiment, the device comprises inputs connected to various points of a clock tree receiving the logic signals which synchronization must be monitored, the logic signals which synchronization must be monitored being clock signals originally from a same clock signal.

An embodiment of the invention also relates to a synchronous circuit comprising synchronous modules clocked by logic signals carried by a clock tree, and a device for detecting synchronization errors according to the invention.

An embodiment of the invention also relates to an integrated circuit comprising synchronous elements clocked by logic signals carried by a clock bus, and a device for detecting synchronization errors according to the invention.

BRIEF DESCRIPTION OF THE SEVERAL VIEWS OF THE DRAWINGS

These features will be described below in further details in the following description of an embodiment of the device for detecting synchronization errors, in relation with, but not limited to the appended figures wherein.

DETAILED DESCRIPTION

All through the present application, it is considered that edges of variation of the clock signal causing the triggering of the synchronous elements of a synchronous circuit, or active edges, are rising edges. However, an inverse convention can be adopted. In that case, what is indicated in the present application about rising edges relates to falling edges.

Figure 7:
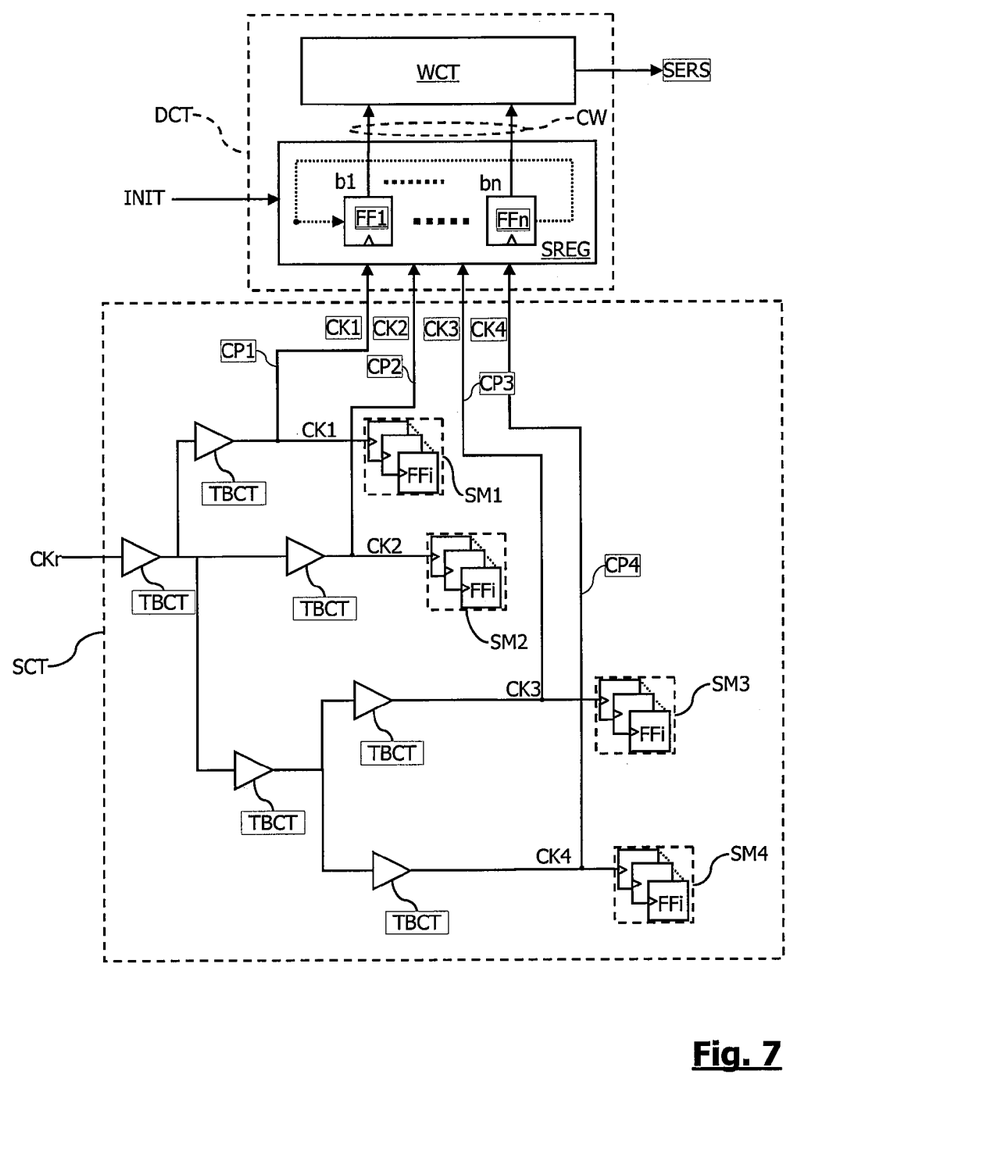

FIG. 7 shows an integrated circuit that includes a synchronous circuit SCT identical to that of FIG. 1, comprising four synchronous modules SM1, SM2, SM3, SM4 and a clock tree respectively supplying to the synchronous modules SM1 to SM4 clock signals CK1, CK2, CK3, CK4 from a same clock signal CKr. The integrated circuit is equipped with a device DCT to detect synchronization errors between the signals CK1 to CK4, i.e. a defect of integrity of the clock tree.

The device DCT receives the signals CK1 to CK4, taken here from the clock inputs of the modules SM1 to SM4 by means of conduction paths CP1, CP2, CP3, CP4. If need be, and although it is not shown, the conduction paths CP1 to CP4 are balanced by means of delay circuits TBCT of the same type of those used to balance the clock tree.

The detection device DCT comprises a shift register SREG and a watch circuit WCT. The shift register SREG comprises n synchronous cells FF1 to FFn clocked by clock signals CK1, CK2, CK3, CK4. The cells FF1 to FFn receive an initialization signal INIT allowing a control word CW of n bits b1 to bn to be loaded into the shift register SREG. The control word CW is monitored by the circuit WCT which supplies an error signal SERS having an inactive value and an active value.

The cells FF1 to FFn are clocked by the clock signals CK1 to CK4, and the control word CW propagates in the shift register at the pace of these various clock signals. A synchronization error between the clock signals CK1 to CK4 causes a change in the value of the control word CW and such a change of value is detected by the watch circuit WCT which then switches the error signal SERS to the active value thereof, for example 0.

Figure 8:
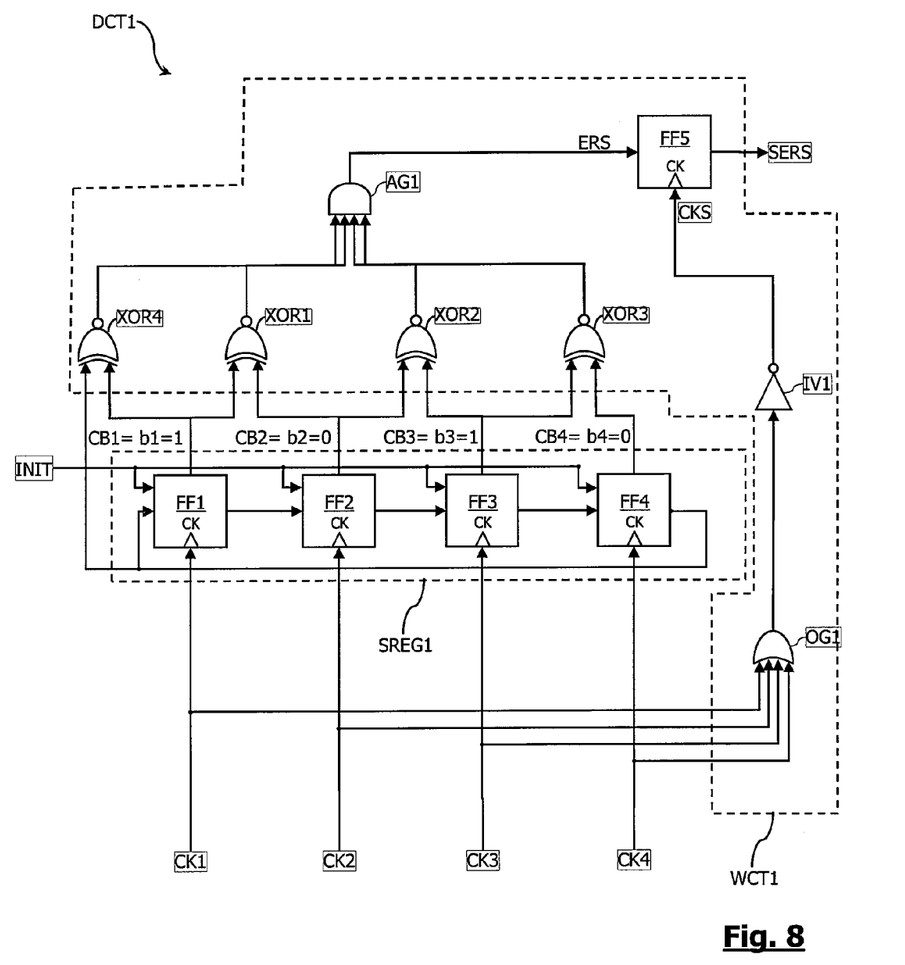
FIG. 8 shows a first embodiment of the device of FIG. 7.
Figure 9:
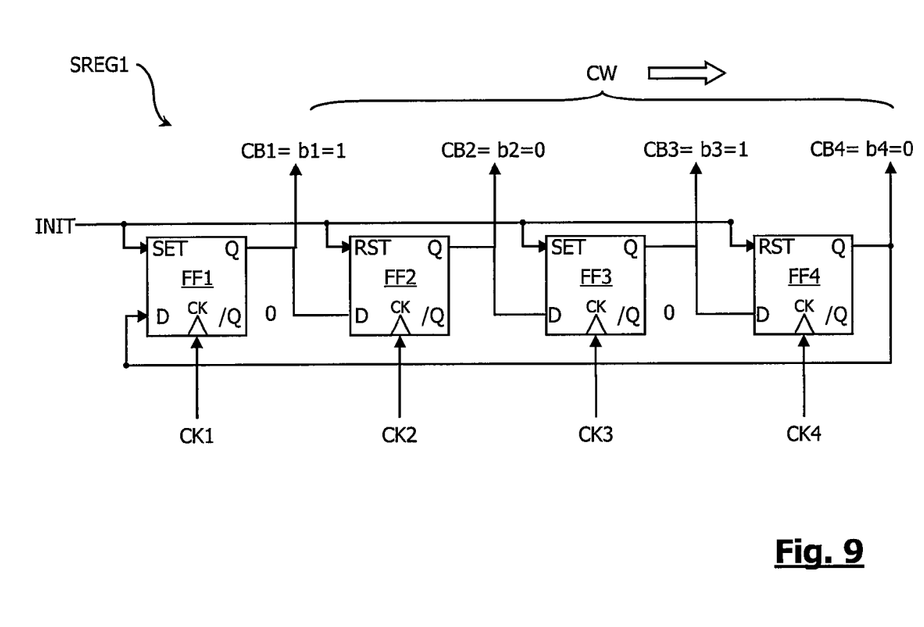
FIG. 9 shows an embodiment of a shift register present in the device of FIG. 8.

FIG. 8 shows an embodiment DCT1 of the detection device, comprising a shift register SREG1 and a monitoring circuit WCT1. FIG. 9 shows an embodiment of the register SREG1.

In FIG. 8, the register SREG1 comprises four flip-flops FF1 to FF4, each flip-flop comprising a data input D, a data output Q, an inverting data output /Q, a clock input CK, a set input SET and a reset input RST. The clock input of the flip-flop FF1 receives the clock signal CK1, the clock input of the flip-flop FF2 receives the clock signal CK2, the clock input of the flip-flop FF3 receives the clock signal CK3 and the clock input of the flip-flop FF4 receives the clock signal CK4.

In FIG. 9, the output Q of the flip-flop FF1 supplies a control bit CB1 and is connected to the input D of the flip-flop FF2. The output Q of the flip-flop FF2 supplies a control bit CB2 and is connected to the input D of the flip-flop FF3. The output Q of the flip-flop FF3 supplies a control bit CB3 and is connected to the input D of the flip-flop FF4. The output Q of the flip-flop FF4 supplies a control bit CB4 and is connected to the input D of the flip-flop FF1. The signal INIT is applied to the inputs SET of the flip-flops FF1 and FF3 and to the inputs RST of the flip-flops FF2 and FF4.

The watch circuit WCT1 comprises four gates XOR1, XOR2, XOR3, XOR4 of the EXCLUSIVE OR type with two inputs each, a gate AG1 of the AND type with four inputs, a gate OG1 of the OR type with four inputs, an inverting gate INV1 and a flip-flop FF5 (FIG. 8). The inputs of the gate XOR1 receive the control bits CB1, CB2, the inputs of the gate XOR2 receive the control bits CB2, CB3, the inputs of the gate XOR3 receive the control bits CB3, CB4 and the inputs of the gate XOR4 receive the control bits CB4, CB1. The inputs of the gate AG1 receive the outputs of the gates XOR1 to XOR4 and the output of the gate AG1 supplies an asynchronous error signal ERS. The latter is applied to the input of the flip-flop FF5, which output supplies the synchronous error signal SERS. The inputs of the gate OG1 receive the four clock signals CK1 to CK4. The output of the gate OG1 is applied to the inverting gate IV1 which supplies a sampling signal CKS. The signal CKS is applied to the clock input of the flip-flop FF5, which thus copies out the signal ERS at each rising edge of the signal CKS.

The shift register SREG1 thus has shift cycles T1, T2, T3, T4, T5, . . . of period equal to the period of the signals CK1 to CK4. When the signal INIT is applied to the flip-flops, for example a rising edge of this signal, a control word CW comprising bits b1, b2, b3, b4 respectively equal to 1, 0, 1 and 0 is loaded into the shift register. The bits b1 to b4 of the control word CW then propagate in loop in the register, so that the value of the control bits CB1 to CB4 supplied by the register is equal to 1010, then 0101, then again 1010, then again 0101, etc.

When the register contains one of the values "0101" or "1010", each gate XOR1 to XOR4 receives a combination of control bits "01" or "10" and the respective outputs of the XOR gates are equal to 1, so that the error signal ERS is equal to 1 (inactive value). If one of the combinations of control bits becomes equal to "00" or "11", at least one of the XOR gates switches to 0 and the signal ERS switches to 0. If the error persists when the signal CKS has a rising edge, the signal SERS also switches to 0 thus indicating that a synchronization error between the clock signals CK1 to CK4 has occurred. Such an error is considered as representative of a localized attack of the clock tree.

This embodiment of the detection device uses a shift register containing an even number of synchronous cells at least equal to the number of clock signals to be monitored, which may become problematic when the number of clock signals to be monitored is very significant (this number being limited to four in the examples described in the present application, for simplicity reasons).

Figure 10:
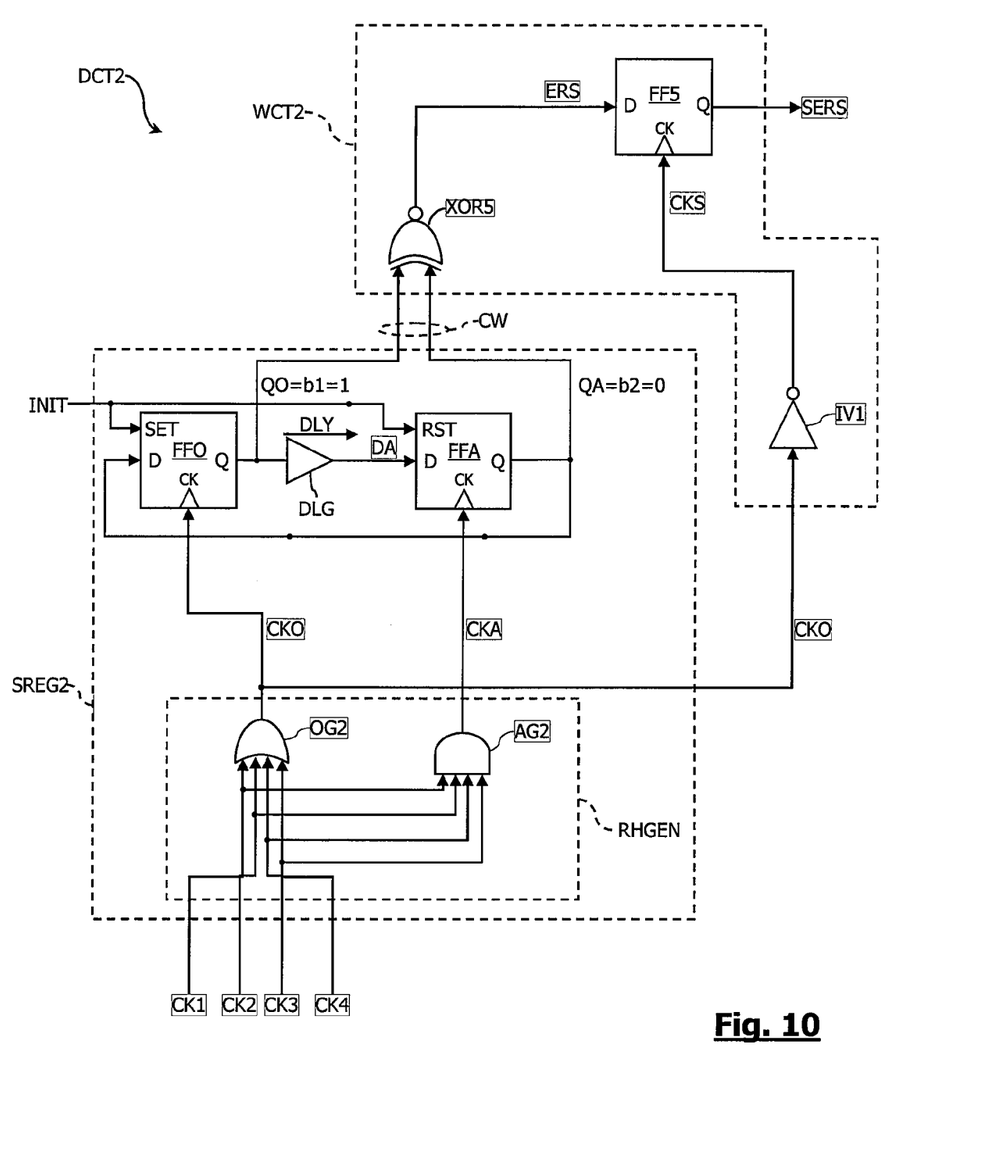
FIG. 10 shows an embodiment of the detection device of FIG. 7, FIGS. 11A to 11I are chronograms showing the normal operation of the device of FIG. 10 in the absence of synchronization error.
Figure 11A:
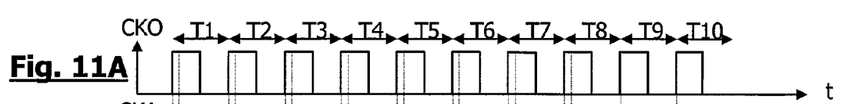
Figure 11B:
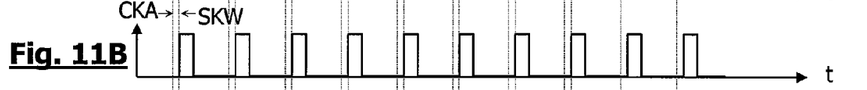
Figure 11C:
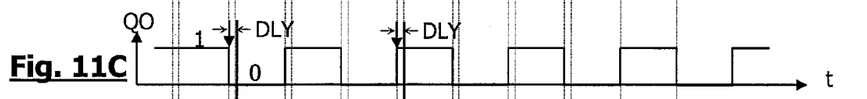
Figure 11D:
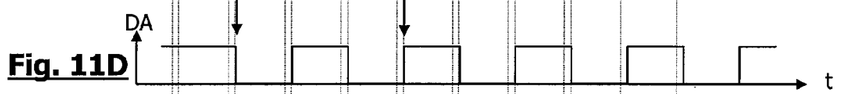
Figure 11E:
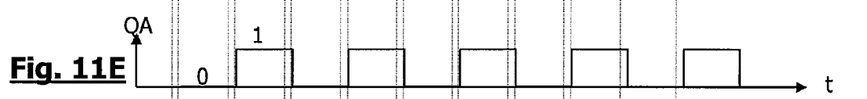
Figure 11F:
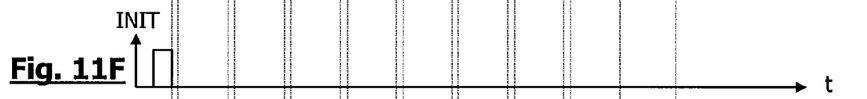
Figure 11G:
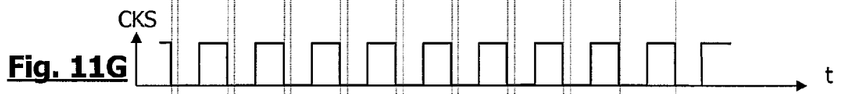
Figure 11H:
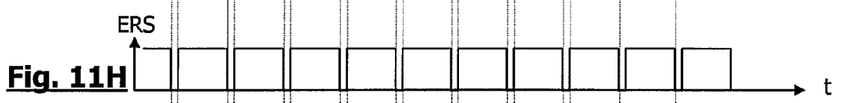
Figure 11I:
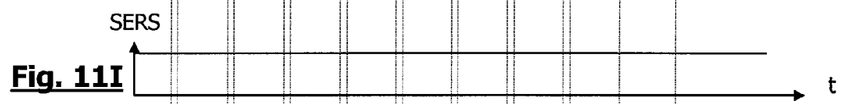

FIG. 10 shows an embodiment DCT2 of the detection device, which requires only two synchronous cells, here two flip-flops FFO, FFA of the same structure as the flip-flops FF1 to FF4 previously described. The detection device DCT2 comprises a shift register SREG2 and a watch circuit referenced WCT2. The shift register SREG2 comprises the flip-flops FFO, FFA and an auxiliary circuit RHGEN. The circuit RHGEN comprises a gate OG2 of OR type with four inputs and a gate AG2 of AND type with four inputs. Each gate receives the clock signals CK1 to CK4. Thus, the gate OG2 supplies a clock signal CKO which is the result of the logical OR of all the clock signals CK1 to CK4 whereas the gate AG2 supplies a clock signal CKA which is the result of the logical AND of all the clock signals CK1 to CK4.

The clock signal CKO is applied to the clock input CK of the flip-flop FFO and the clock signal CKA is applied to the clock input CK of the flip-flop FFA. The signal INIT is applied to the input SET of the flip-flop FFO and to the input RST of the flip-flop FFA. The output Q of the flip-flop FFA supplies a control bit QA which is applied to the input D of the flip-flop FFO. The output Q of the flip-flop FFO supplies a control bit QO which is applied to the input D of the flip-flop FFA through a delay circuit DLG introducing a delay DLY between the instant when a rising or falling edge appears on the output Q of the flip-flop FFA and the instant when this edge is applied to the input D of the flip-flop FFA. The bit applied to the input D of the flip-flop FFA will be referenced DA to be distinguished from the control bit QO.

For some reasons that will appear below, the delay DLY is preferably at least equal to the maximum value of the tolerated error SKW (error of balance of the clock tree). Preferably, the delay DLY is not however much higher than this maximum value. On the contrary, the device may not detect synchronization errors of short duration occurring in a time interval comprised between the end of the error delay SKW, calculated after a change of clock cycle, and the end of the delay DLY, also calculated after a change of clock cycle. Thus, preferably, the delay DLY may be higher than (but very close to) the maximum value of the tolerated error SKW.

The watch circuit WCT2 comprises here a gate XOR5 of OR EXCLUSIVE type with two inputs as well as the inverting gate IV1 and the flip-flop FF5 previously described. The gate XOR5 receives the control bits QO, QA and supplies the asynchronous error signal ERS which is applied, as previously, to the input D of the flip-flop FF5 which output supplies the synchronous error signal SERS. The inverting gate IV1 receives here the resulting clock signal CKO, equivalent to the signal supplied by the gate OG1 in FIG. 8, and applies the sampling signal CKS to the clock input CK of the flip-flop FF5.

After the application of the signal INIT to the flip-flops FFO, FFA, a control word CW only comprising two bits b1 and b2, respectively equal to 1 and 0, is loaded into the shift register (it is also possible to provide a control word equal to 01). The signals CKO and CKA have clock cycles corresponding to the clock cycles of the clock signals CK1 to CK4, and clock the register SREG2 so that the control word CW propagates in loop therein, so that the gate XOR5 receives couples of bits QO, QA equal to 01 or 10 and the error signals ERS or SERS remain equal to 1.

The use of the resulting clock signals CKO and CKA allows the structure of the detection device to be substantially simplified without loss of sensitivity in terms of detection of synchronization errors. Any error injected into one signal CK1 to CK4 is inevitably translated by an equivalent error on one resulting clock signal CKO or CKA and causes the switch of the error signal SERS to the active state, as it will be better understood by referring to the chronograms shown in FIGS. 11A to 16I.

The operation of the device DCT2 during cycles T1 to T10 is illustrated by FIGS. 11A to 11I, 12A to 12I, 13A to 13I, 14A to 14I, 15A to 15I, and 16A to 16I, wherein:

FIGS. 11A to 16A show the signal CKO,
FIGS. 11B to 16B show the signal CKA,
FIGS. 11C to 16C show the control bit QO,
FIGS. 11D to 16D show the bit DA at the input D of the flip-flop FFA (output of the delay circuit DLG),
FIGS. 11E to 21E show the control bit QA,
FIGS. 11F to 16F show the signal INIT,
FIGS. 11G to 16G show the signal CKS,
FIGS. 11H to 16H show the signal ERS, and
FIGS. 11I to 16I show the signal SERS.

In these chronograms, the tolerated error SKW has been substantially expanded for a better legibility of the figures.

FIGS. 11A to 11I show the normal operation of the device DCT2 in the absence of synchronization error. It appears that the clock signal CKA has rising edges behind the rising edges of the signal CKO and falling edges before the falling edges of the signal CKO. The signal CKO being the result of the OR function of all the clock signals to be monitored CK1 to CK4, one clock signal that switches to 1 is enough indeed for the signal CKO to switch to 1. Conversely, the signal CKA being the result of the AND function of all the clock signals CK1 to CK4, the signal CKA switches to 1 only when all the signals CK1 to CK4 are equal to 1 and switches to 0 when at least one clock signal switches to 0. The tolerated error SKW between the signals CK1 to CK4 is thus the cause of the delay in the apparition of the rising edges of the signal CKA in relation to the rising edges of the signal CKO, the latter appearing here right at the beginning of each clock cycle T1 to T10.

It also appears that the bit DA copies out the bit QO with the delay DLY which is at least equal to the maximum value of the tolerated error SKW, so that at the instant when a rising edge of the signal CKA appears, the bit QA copies out the value of the bit DA which is still equal to the value that had the bit QO at the instant when the rising edge of the signal CKO appeared. Thus, the delay DLY makes it possible to correct the loss of synchronization due to the fact that the clock signals CKO and CKA have rising edges substantially shifted due to the tolerated error SKW.

Figure 12A:
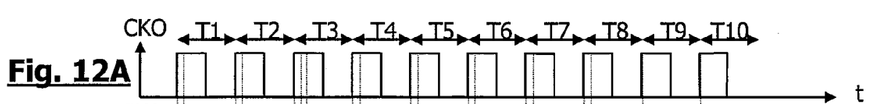
FIGS. 12A to 12I, 13A to 13I, 14A to 14I, 15A to 15I, 16A to 16I are chronograms showing the operation of the device of FIG. 10 in response to an injection into the clock tree of an error of a first type, a second type, a third type, a fourth type and a fifth type, respectively.
Figure 12B:
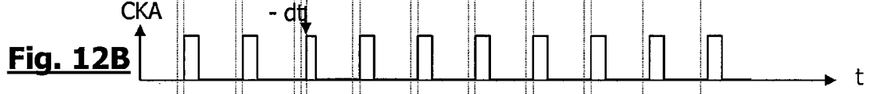
Figure 12C:
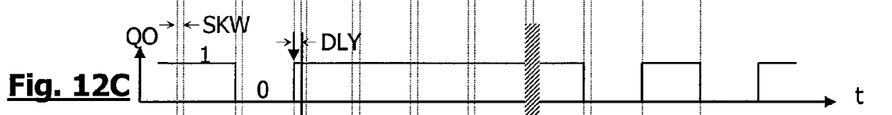
Figure 12D:
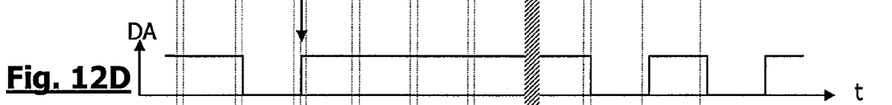
Figure 12E:
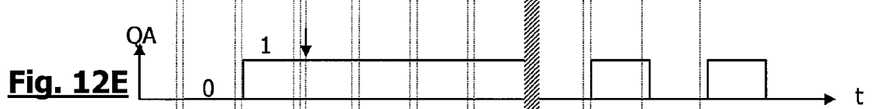
Figure 12F:
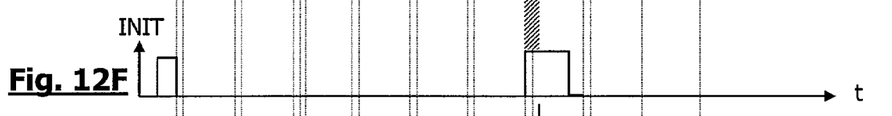
Figure 12G:
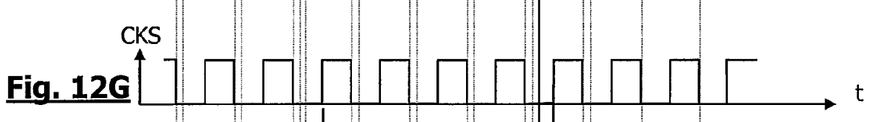
Figure 12H:
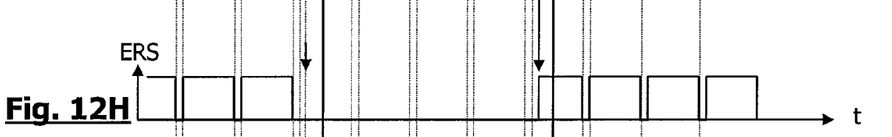
Figure 12I:
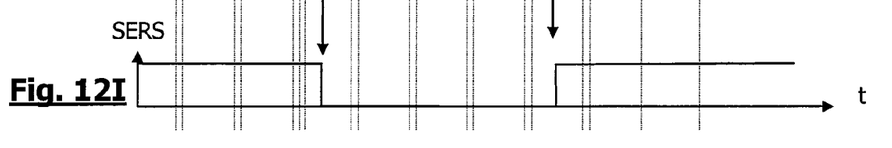
Figure 13A:
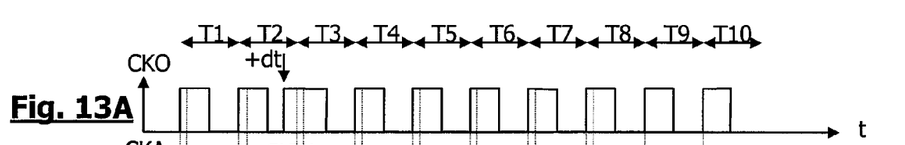
Figure 13B:
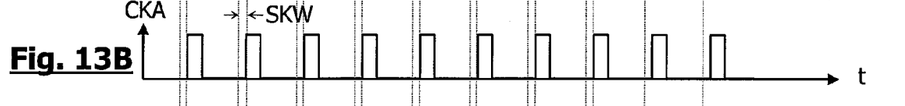
Figure 13C:
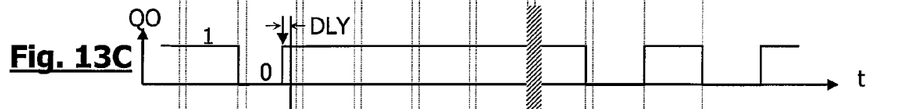
Figure 13D:
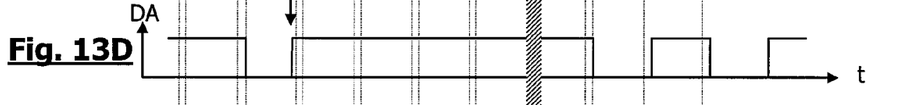
Figure 13E:
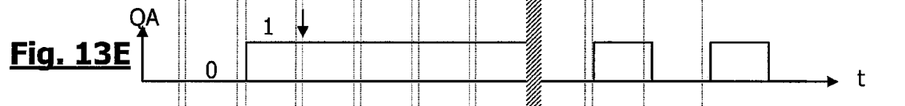
Figure 13F:
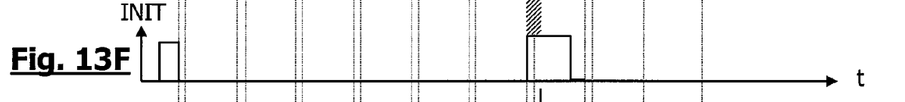
Figure 13G:
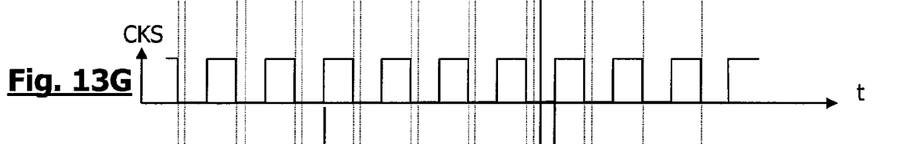
Figure 13H:
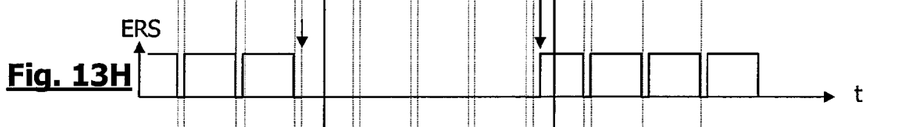
Figure 13I:
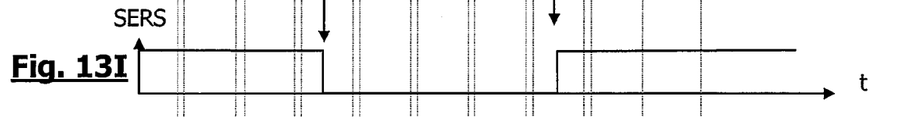
Figure 14A:
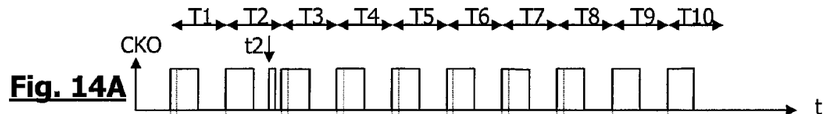
Figure 14B:
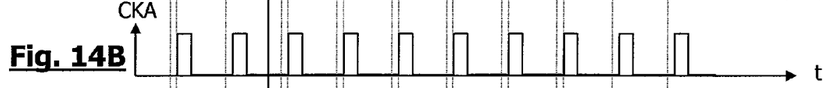
Figure 14C:
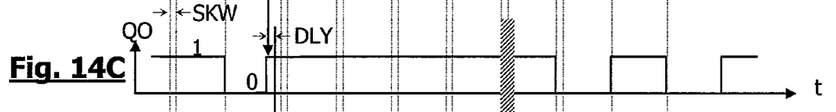
Figure 14D:
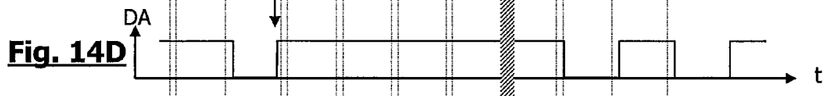
Figure 14E:
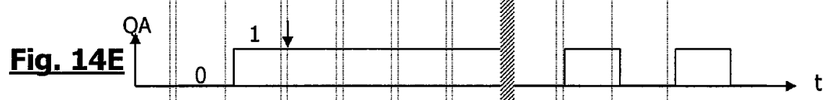
Figure 14F:
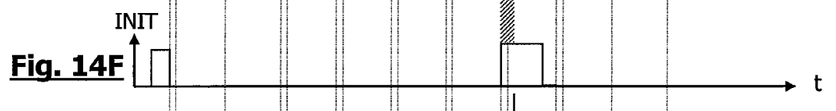
Figure 14G:
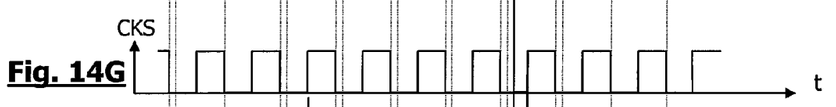
Figure 14H:
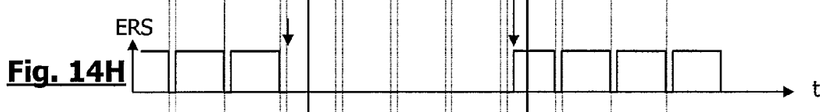
Figure 14I:
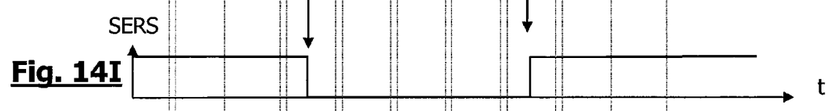
Figure 15A:
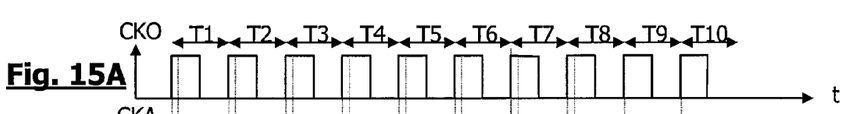
Figure 15B:
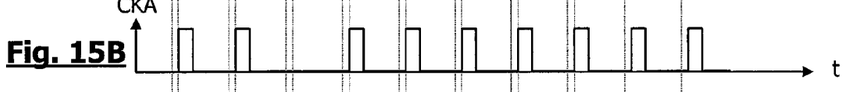
Figure 15C:
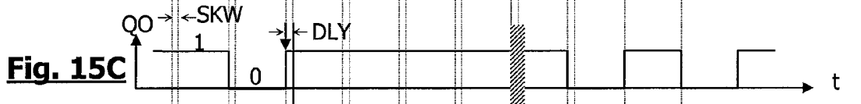
Figure 15D:
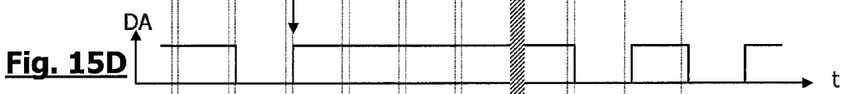
Figure 15E:
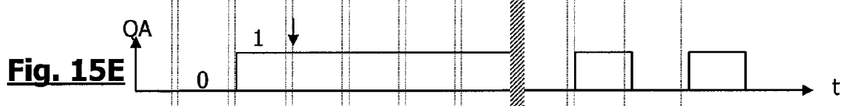
Figure 15F:
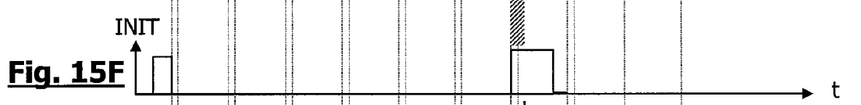
Figure 15G:
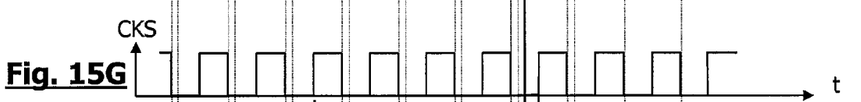
Figure 15H:
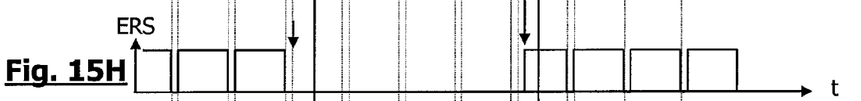
Figure 15I:
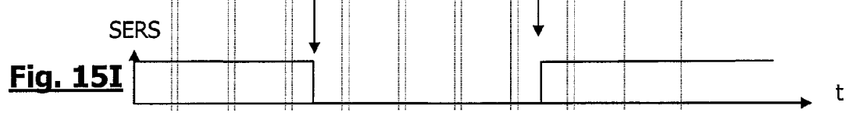
Figure 16A:
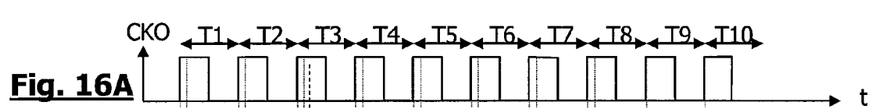
Figure 16B:
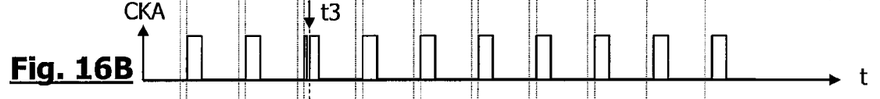
Figure 16C:
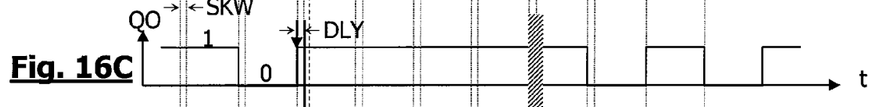
Figure 16D:
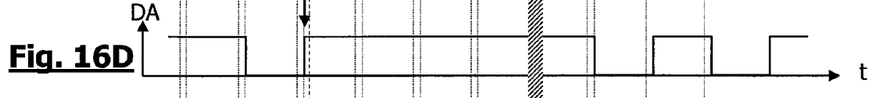
Figure 16E:
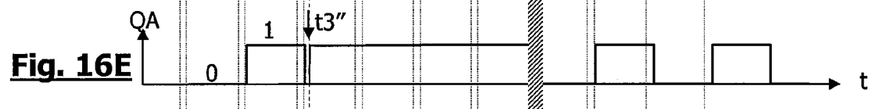
Figure 16F:
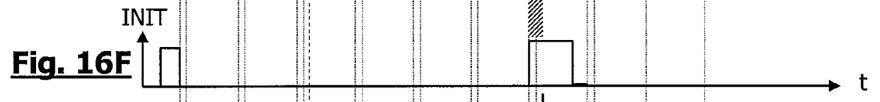
Figure 16G:
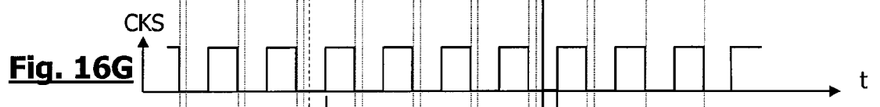
Figure 16H:
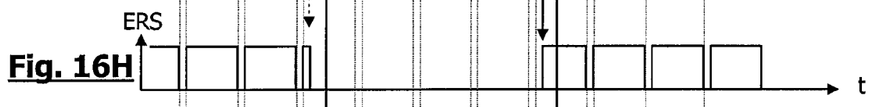
Figure 16I:
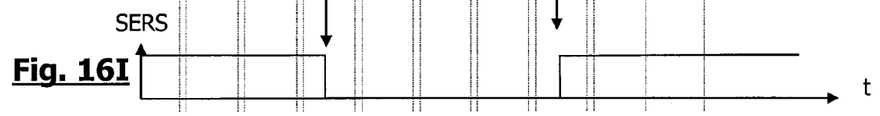

FIGS. 12A to 12I show the operation of the device DCT2 in the case of an error injection applied to any clock signal CK1 to CK4 during the cycle T3, or to several signals, causing a delay −dt in the apparition of the rising edge of the clock signal(s) concerned, in relation to the beginning of the cycle T3. This delay affects the clock signal CKA (effects of the AND function) and causes a similar delay −dt in the apparition of the rising edge of the clock signal CKA in relation to the beginning of the cycle T3. This delay −dt is assumed to be more important than the error tolerated SKW and causes a delay equal to "dt-SKW" in the apparition of the rising edge of the signal CKA (FIG. 12B). Thus, when the bit DA copies out the bit QO (with the delay DLY) and switches to 1, the flip-flop FFA has not switched yet. When the flip-flop FFA switches, the bit DA has become equal to 1 and the control bit QA, which copies out the bit DA, remains equal to 1 instead of switching to 0. The asynchronous error signal ERS, instead of switching again to 1, remains equal to 0. In the middle of the clock cycle, the signal SERS switches to 1 (CKO switching to 0) and remains equal to 0 as long as the signal INIT has not been applied to the detection device, here during the cycle T7. Indeed, after the error on the bit QA, the two control bits are equal to 1 and the error remains in the shift register from cycle to cycle.

FIGS. 13A to 13I show the operation of the device DCT2 in the case of an error injection applied to one clock signal CK1 to CK4 or to several clock signals, causing an advance +dt in the apparition of the rising edge(s) of the clock signal(s) concerned. This advance affects the clock signal CKO (effects of the OR function) and causes a similar advance +dt in the apparition of the rising edge of the signal CKO, which here appears before the end of the cycle T2 instead of appearing at the beginning of the cycle T3. Thus, the control bit QO copies out the control bit QA and prematurely switches to 0. When the rising edge of the signal CKA appears, the bit DA has already switched to 1 and the bit QA also switches to 1. As previously, both control bits are therefore equal to 1, the signal ERS and then the signal SERS switch to 0 and remain equal to 0 until the cycle T7 when the signal INIT is applied to the detection device.

FIGS. 14A to 14I show the operation of the device DCT2 in the case of an error injection applied to one clock signal CK1 to CK4, or to several of these signals, causing the apparition of an additional clock square wave at an instant t2 between the falling edge of the clock square wave emitted during the cycle T2 and the rising edge of the clock square wave emitted during the cycle T3. The error affects the resulting signal CKO which also has the additional clock square wave. This parasite square wave causes as previously the anticipated switching to 1 of the bit QO and then the bit DA, and the bit QA then remains equal to 1 instead of switching to 0, so that the error signals ERS and SERS successively switch to 0.

FIGS. 15A to 15I show the operation of the device DCT2 in the case of an error injection in one or several clock signals CK1 to CK4, causing the disappearance of the clock square wave of the clock signal(s) concerned. The error affects the clock signal CKA which does not have any clock square wave either during the cycle T3. Consequently, the flip-flop FFA does not switch and the bit QA remains equal to 1 instead of switching to 0. As previously, both control bits are therefore equal to 1, the signal ERS and then the signal SERS switch to 0 and remain equal to 0 until the cycle T7 when the signal INIT is applied to the detection device.

FIGS. 16A to 16I show the operation of the device DCT2 in the case of an error injection of a fifth type which is in reality equivalent to the error injection of the third type (adding a clock square wave). The error is applied to one or several clock signals CK1 to CK4 during the cycle T3 and is translated by the apparition of a disturbance forming a "hole" in the clock square wave of the clock signal(s) concerned. This hole affects the clock signal CKA and causes a similar hole in the square wave CKA of the cycle T3. The signal CKA reappearing at an instant t3, at the end of the disturbance, forms a second rising edge during the cycle T3 and corresponds to adding a parasite clock square wave CKA. This parasite square wave causes the control bit QA to switch to 1 little time after its switching to 0, so that both control bits are equal to 1 again. The signal ERS switches to 0 then the signal SERS also switches to 0 and remains equal to 0 until the signal INIT is applied to the detection device again.

It will be clear to those skilled in the art that the present invention is susceptible of various other embodiments. The use of synchronous flip-flops of the type described above is not essential for the implementation of the invention. The shift register may for example be made from a volatile memory (RAM memory) controlled by a logical circuit clocked by various clock signals to be monitored, making the bits of the control word pass through one memory cell to the other, each memory cell then forming a cell of shift register.

The present invention is also susceptible of various applications. In FIG. 7, the usual schematic representation of the synchronous modules SM1-SM4 designates any type of synchronous circuit like a microprocessor or an element of microprocessor, an encryption calculation circuit or a part of such a circuit, an address decoding circuit, a memory reader circuit or a part of such a circuit, etc.

Figure 17:
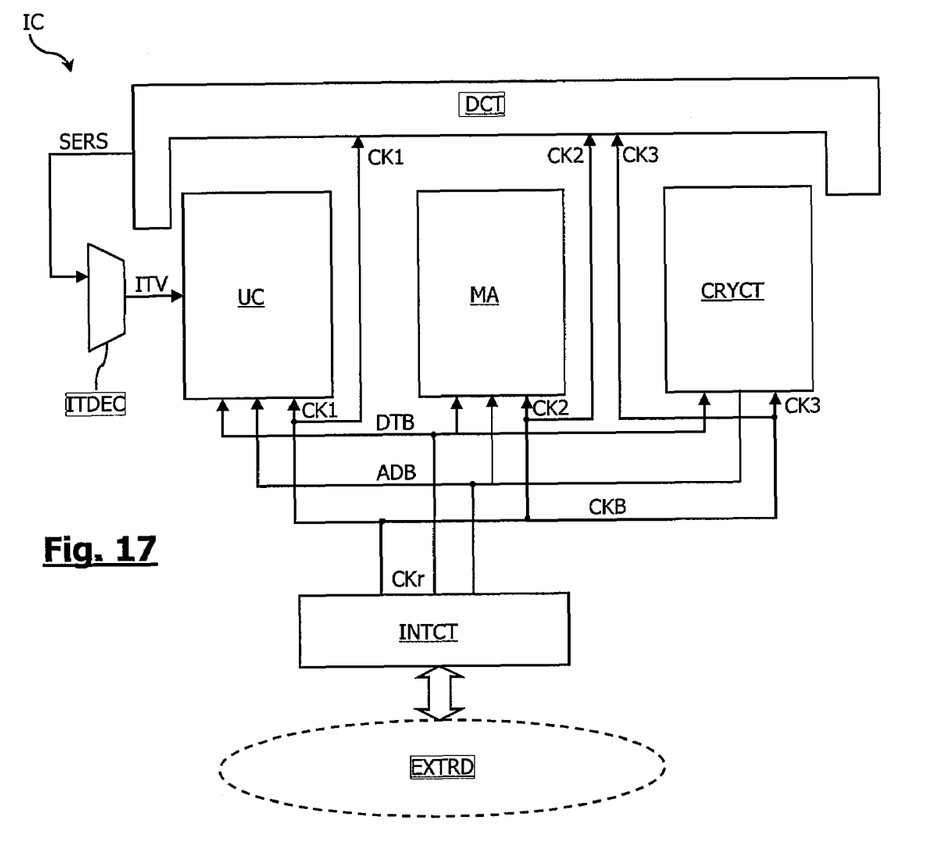
FIG. 17 shows the architecture of an integrated circuit comprising a detection device according to FIG. 7.

FIG. 17 shows an integrated circuit IC for a chipcard or electronic tag according to one embodiment. The integrated circuit IC comprises a microprocessor central unit UC, a memory array MA comprising areas of volatile memory (RAM) and areas of non-volatile memory (ROM, EEPROM, FLASH . . . ), an encryption circuit CRYCT allowing the integrated circuit to authenticate during a transaction, and an interface circuit INTCT allowing it to communicate with external chipcard or electronic tag readers (EXTRD). The interface circuit INTCT may be of the contact type and comprise for example ISO 7816 contacts (clock, data, supply, ground, etc contacts). It may also be of the contactless RFID type (Radio Frequency Identification) and comprise an antenna coil RF or an antenna circuit UHF, circuits for modulating and demodulating outgoing and incoming data, a clock extractor circuit, etc. The central unit UC, the memory array MA and the circuit CRYCT are linked by a data bus DTB, an address bus ADB and a clock bus CKB. In such an application, the source of a clock signal is usually located in the interface circuit (ISO 7816 contact supplying the clock signal or circuit extracting the clock signal from a carrier RF or UHF) but may also be implemented in the integrated circuit if the latter has an autonomous supply of electric energy (battery). The clock tree is here formed by the branching of the clock bus as well the branching internal to each element UC, MA, CRYCT which are not shown.

The integrated circuit is equipped with a circuit DCT according to the invention, providing the detection of synchronization errors between the branches of the clock tree. The circuit DCT receives for example a signal CK1 taken from the input of the central unit UC, a signal CK2 taken from the input of the memory array MA, and a signal CK3 taken from the input of the circuit CRYCT. These clock signals or other clock signals may also be taken from the inside of these elements if they comprise branching of the clock tree. The circuit DCT supplies the synchronous error signal SERS which is sent to the central unit to take urgency measures in response to the signal SERS switching to the active value. These urgency measures may be executed by a wired-logic protection circuit specifically provided to that end, which may for example cause a hardware reset of the central unit, an erasure, a destruction or a lock of some parts of the memory array, etc. They may also be processed by the central unit by switching the latter to a dedicated sub-program. In that case, and as shown, the error signal SERS is applied to an interruption decoder ITDEC which supplies to the central unit UC an interruption vector ITV when the error signal SERS has the active value.

The present invention is also susceptible of various applications different of monitoring a clock signal. For example, when data are sent to several elements through a data tree, a detection device according to the invention may be used to detect a data corruption in the data tree, for example the removal or addition of a datum in a branch of the tree.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
    detecting synchronization errors between logic signals of a group of logic signals, the detecting including:
    providing a shift register that includes a first synchronous cell and a second synchronous cell;
    loading a control word into the shift register;
    obtaining a first resulting logic signal by applying an OR logic function to the logic signals of the group of logic signals;

clocking the first synchronous cell with the first resulting logic signal;

obtaining a second resulting logic signal by applying an AND logic function to the logic signals of the group of logic signals;

clocking the second synchronous cell with the second resulting logic signal;

propagating the control word in the shift register according to the clocking steps and monitoring the control word during the propagating; and detecting a synchronization error if the control word changes value.

2. The method according to claim 1, comprising:

producing an asynchronous error signal having an inactive value and an active value, and bringing the asynchronous error signal to the active value when the control word changes value; and sampling the asynchronous error signal after each shift of the control word in the shift register, in order to filter synchronization errors tolerated and to produce a synchronous error signal.

3. The method according to claim 2, wherein the synchronous error signal is cyclically refreshed by edges of the first resulting logic signal.

4. The method according to claim 1, wherein:

the control word includes at least one couple of control bits having inverse logic values; and detecting the synchronization error includes detecting the synchronization error if the control bits have the same value during the propagation of the control word in the shift register.

5. The method according to claim 1, comprising introducing between the first synchronous cell and the second synchronous cell a propagation delay greater than or equal to a maximum time shift tolerated between the logic signals.

6. The method according to claim 1, wherein loading the control word comprises a step of initializing each synchronous cell of the shift register with a signal for setting the cell to 0 or 1.

7. The method according claim 1, wherein the synchronous cells of the shift register are flip-flops, each flip-flop comprising a clock input receiving one of the resulting logic signals, a data input and an inverting or non-inverting data output.

8. The method according to claim 1, wherein the logic signals are clock signals taken from various points of a clock tree and originally from a same clock signal.

9. A device for detecting synchronization errors between logic signals of a group of logic signals, comprising:

a shift register comprising a first synchronous cell and a second synchronous cell;

means for loading a control word in the shift register;

means for connecting an output of the shift register to an input of the shift register;

means for obtaining a first resulting logic signal by applying an OR logic function to the logic signals of the group of logic signals;

means for clocking the first synchronous cell with the first resulting logic signal equal;

means for obtaining a second resulting logic signal by applying an AND logic function to the logic signals of the group of logic signals;

means for clocking the second synchronous cell with the second resulting logic signal; and means for monitoring the control word as it propagates in the shift register at the clocking of the logic signals, and for sending a synchronization error signal if the control word changes value.

10. The device according to claim 9, wherein the means for monitoring the control word comprise:

means for producing an asynchronous error signal having an inactive value and an active value, and for switching the asynchronous error signal to the active value when the control word changes value; and means for sampling the asynchronous error signal after each shift of the control word in the shift register, in order to filter synchronization errors tolerated and to produce the synchronization error signal.

11. The device according to claim 10, wherein the means for sampling the asynchronous error signal are driven by edges of the first resulting logic signal.

12. The device according to claim 9, wherein:

the means for loading a control word are arranged to load into the shift register a control word comprising a couple of control bits having inverse logic values; and the means for monitoring the value of the control word are arranged to emit the synchronization error signal if the control bits have the same value during the propagation of the control word in the shift register.

13. The device according to claim 9, wherein the shift register comprises, between the first synchronous cell and the second synchronous cell, a delay circuit introducing a propagation delay greater than or equal to a maximum time shift tolerated between the logic signals.

14. The device according to claim 9, wherein the means for loading a control word in the shift register comprise a signal for setting each synchronous cell of the shift register to 0 or 1.

15. The device according claim 9, wherein the synchronous cells of the shift register are flip-flops, each flip-flop comprising a clock input receiving one of the resulting logic signals, a data input and an inverting or non-inverting data output.

16. The device according to claim 9, comprising inputs, connected to various points of a clock tree, receiving the logic signals, the logic signals being clock signals originally from a same clock signal.

17. A circuit, comprising:

synchronous modules clocked by logic signals; and a device for detecting synchronization errors in the logic signals, the device including:

a shift register comprising a first synchronous cell and a second synchronous cell;

means for loading a control word in the shift register;

means for connecting an output of the shift register to an input of the shift register;

means for obtaining a first resulting logic signal by applying an OR logic function to the logic signals of the group of logic signals;

means for clocking the first synchronous cell with the first resulting logic signal equal;

means for obtaining a second resulting logic signal by applying an AND logic function to the logic signals of the group of logic signals;

means for clocking the second synchronous cell with the second resulting logic signal; and means for monitoring the control word as it propagates in the shift register at the clocking of the logic signals, and for sending a synchronization error signal if the control word changes value.

18. The circuit of claim 17 wherein the circuit is integrated and the logic signals are carried by a clock bus, and the device includes inputs configured to receive logic signals applied to the synchronous modules or taken from inside the synchronous modules.

19. The circuit according to claim 17, wherein the means for monitoring the control word comprise:

means for producing an asynchronous error signal having an inactive value and an active value, and for switching the asynchronous error signal to the active value when the control word changes value; and means for sampling the asynchronous error signal after each shift of the control word in the shift register, in order to filter synchronization errors tolerated and to produce the synchronization error signal.

20. The circuit according to claim 19, wherein the means for sampling the asynchronous error signal are driven by edges of the first resulting logic signal.

21. The circuit according to claim 17, wherein:

the means for loading a control word are arranged to load into the shift register a control word comprising a couple of control bits having inverse logic values; and the means for monitoring the value of the control word are arranged to emit the synchronization error signal if the control bits have the same value during the propagation of the control word in the shift register.

22. The circuit according to claim 17, wherein the shift register comprises, between the first synchronous cell and the second synchronous cell, a delay circuit introducing a propagation delay greater than or equal to a maximum time shift tolerated between the logic signals.

23. The circuit according to claim 17, wherein the means for loading a control word in the shift register comprise a signal for setting each synchronous cell of the shift register to 0 or 1.

24. The circuit according to claim 17, wherein the synchronous cells of the shift register are flip-flops, each flip-flop comprising a clock input receiving one of the resulting logic signals, a data input and an inverting or non-inverting data output.

25. The circuit according to claim 17, further comprising a clock tree that includes clock signals originally from a same clock signal, the clock signals being the logic signals.

* * * * *